United States Patent
Andler et al.

[11] Patent Number: 6,139,191
[45] Date of Patent: Oct. 31, 2000

[54] HALF BEARING

[75] Inventors: Gerd Andler, Frankfurt; Jens-Peter Heinss; Klaus Goedicke, both of Dresden; Christoph Metzner, Pappritz, all of Germany

[73] Assignee: Federal-Mogul Wiesbaden GmbH, Wiesbaden, Germany

[21] Appl. No.: 09/322,464

[22] Filed: May 28, 1999

[30]     Foreign Application Priority Data

Jun. 2, 1998 [DE] Germany .......................... 198 24 308

[51] Int. Cl.[7] .................................................. F16C 33/02
[52] U.S. Cl. .......................................... 384/276; 384/912
[58] Field of Search .................................. 384/276, 288, 384/294, 625, 912, 913

[56]                References Cited

U.S. PATENT DOCUMENTS

| | | |
|---|---|---|
| 4,889,772 | 12/1989 | Bergmann et al. ................. 384/912 X |
| 4,996,025 | 2/1991 | Pratt et al. ........................... 384/276 X |
| 5,053,286 | 10/1991 | Pratt et al. ........................... 384/912 X |
| 5,137,792 | 8/1992 | Hodes et al. ......................... 384/912 X |
| 5,955,202 | 9/1999 | Steeg et al. .......................... 384/912 X |

*Primary Examiner*—Thomas R. Hannon
*Attorney, Agent, or Firm*—Reising, Ethington, Barnes, Kisselle, Learman & McCulloch, P.C.

[57]                ABSTRACT

A half bearing has a backing member and at least one metallic overlay, which is applied by electron beam vapor deposition and which comprises at least one finely dispersed component in a matrix material, the atomic weight of which component is greater than that of the matrix material, wherein the concentration of the finely dispersed component (7) decreases continuously from the apex area (8) of the half bearing (1) towards the area (9) of the partial surfaces. The method is characterized in that, during the coating process, an inert gas pressure of 0.1 to 5 Pa is set in the apex area of the bearing shell.

9 Claims, 3 Drawing Sheets

HALF BEARING

BACKGROUND OF THE INVENTION

1. Technical Field

The invention relates to a half bearing, comprising a backing member and at least one metallic overlay, which is applied by means of electron beam vapour deposition and which comprises at least one finely dispersed component in a matrix material, the atomic weight of which component is greater than that of the matrix material.

2. Related Prior Art

In general, sliding elements used for such purposes comprise multilayer composite systems of the following construction: steel support member serving as backing material, bearing metal layer of a Cu, Al or white metal alloy and a so-called sliding or third layer or overlay, which may be applied either by an electroplating process (E. Römer: Three-component bearings of GLYCO 40; GLYCO Engineering Report August 1967) or by a cathodic sputtering process as described in EP 0 256 226 B1. Layers applied by electroplating, which are generally based on Pb or Sn, exhibit the disadvantages of frequently inadequate corrosion resistance and low wear resistance. Furthermore, the electroplating process is in itself dubious from the environmental point of the view.

Where overlays are applied by the sputtering method, a considerable cost factor is introduced with respect to the complete sliding element, owing to the low deposition rates achievable therewith and the high technical complexity of the equipment needed.

GB 2270 927 describes aluminium alloys in which the SN content of the entire layer may be constant and lie between 10 and 80%. From Table 1 on pages 10 and 11 of this application it may be seen that, as the tin content increases, the possible limit load before the bearing demonstrates a tendency to corrode increases, while, on the other hand, the load-carrying capacity drops again drastically from a certain tin content. This specification does not contain any suggestions for improving running-in behaviour. Sputtering is mentioned in this application as a production process for applying the overlay.

EP 0 376 368 B1 describes a very complex process for producing a bearing which is distinguished by good emergency running and running-in properties. This application also relates to aluminium-tin alloys, which are applied by means of a sputtering process. The nub of this application is that the particles incorporated in the metallic base material of the bearing alloy obey the rules of standard random distribution with respect to the diameter thereof, and that up to 1.0 wt. % oxygen is incorporated in the overlay, the micro-hardness of the overlay diminishing after heat treatment. In this way, the embeddability, emergency running properties and insensitivity to corrosion are improved.

WO 91/00375 describes a bearing whose overlay consists of a base material (e.g. aluminium) with a second phase (e.g. tin) dispersed finely therein. Here too a sputtering process is used. The aim of this invention is to produce a bearing whose overlay structure is such that the content of the second phase (e.g. tin) in the overlay increases in accordance with the thickness of the overlay continuously from 0% in the bottom layers to 100% in the top layers. This is effected on the one hand by the use of several targets of differing compositions or of varying sputtering parameters during coating. Overlays produced in this way exhibit very good properties from the point of view of their wear and fatigue behaviour, which is achieved, however, by using a very complex process.

It is known from DE 195 14 835 A1 and 195 14 836 A1 to deposit overlays on concavely curved sliding elements by means of electron beam vapour deposition, wherein in both specifications the formation of particular layer thickness profiles is a priority. In order to achieve a uniform layer thickness for half bearings, according to DE 195 14 835 A1 the evaporating apparatus and backing member are moved relative to one another in linear manner and at different speeds during evaporation coating. To this end, appropriate adjusting means are required inside the coating chamber. The intention of DE 195 14 836 A1, on the other hand, is to produce a non-uniform layer thickness. The layer thickness of the sliding element is at its greatest in the apex area and reduces continuously towards the partial surfaces. In order to achieve this, the method provides that a distance be set between the evaporating apparatus and the apex area of the half bearing of 150 to 350 mm, that during evaporation coating of the layer the evaporating apparatus the backing member be positioned in fixed relation to each other and that the condensation rate for deposition in the apex area be set at at least 80 nm/s.

A method is known from DE 36 06 529 A1 for producing multilayer materials or multilayer workpieces by the vapour deposition of at least one metallic material onto a metallic substrate, an electron beam vapour deposition process likewise being used to apply the overlay. The method is carried out in a residual gas atmosphere under pressures ranging from $10^{-2}$–$10^{-3}$ mbar, wherein the material is dispersion-hardened or dispersion-strengthened simultaneously with the vapour deposition. Coating rates are set at approximately 0.3 $\mu$m/s. During vapour deposition, the substrate is kept at a temperature between 200° C. and 800° C. The temperature of the substrate is 200° C. to 300° C. for vapour deposition of aluminium alloys and in the range of from 500° C. to 700° C. for vapour deposition of copper-lead alloys. The load-carrying capacity of the layers produced according to this method is markedly better than that of layers produced by powder-metallurgical methods. A priority of this application is to produce a defined hard phase content in the overlay by dispersion strengthening, e.g. by producing oxides during vapour deposition.

These three specifications relating to electron beam vapour deposition do not give any indications as to how to achieve different distributions of the alloy components. The load-carrying capacity or running-in behaviour are not adequate for some applications.

SUMMARY OF THE INVENTION

The object of the invention is to provide a half bearing which is distinguished, preferably in its highly loaded areas, by good emergency running and running-in behaviour combined with high limit loads before the onset of bearing corrosion. It is also the object of the invention to provide an economic method based on electron beam vapour deposition for the production of such half bearings, which method additionally ensures in a simple manner a uniform layer thickness over the entire circumference of the bearing shell.

The half bearing is characterised in that the concentration of the finely dispersed component decreases continuously from the apex area of the half bearing towards the area of the partial surfaces.

An overlay constructed in this way has the advantage that, in the most highly loaded area, namely the apex area, that alloy component which has a decisive positive influence on emergency running and running-in behaviour is present in the highest concentration. Another advantage consists in the fact that the relatively expensive, finely dispersed component is present in a correspondingly high concentration only in those areas where it is chiefly required in relation to emergency running and running-in behaviour.

Since the sliding properties of the most highly loaded areas affect the service life of the entire plain bearing, an increase in service life is also ensured by an increase in the concentration of the finely dispersed alloy component in the apex area.

The concentration of the finely dispersed component in the apex area is preferably higher in the apex area than in the area of the partial surfaces by a factor of 1.2 to 1.8, preferably 1.3 to 1.6.

According to a first embodiment, the concentration of the finely dispersed component is constant over the thickness of the overlay.

This concentration distribution in the circumferential direction may also be combined, according to a second embodiment, with a different concentration over the layer thickness, wherein the concentration of the finely dispersed component preferably increases continuously from the lower side, i.e. the side in the vicinity of the backing member, to the upper area of the overlay. This embodiment of the overlay is selected when the half bearing countermember exhibits high levels of surface roughness, as is the case with cast shafts, for instance.

The concentration of the finely dispersed component in the upper area of the overlay is preferably up to 2 times greater than in the lower area.

The concentration of the finely dispersed component in the apex area amounts advantageously to between 10 and 70 wt. %.

The matrix material preferably consists of aluminium, wherein the finely dispersed component may consist of tin, lead, bismuth and/or antimony. As its other alloy component, the overlay may comprise copper, zinc, silicon, manganese and/or nickel individually or in combination in a proportion of up to 5 wt. %.

The backing members may comprise steel supporting shells, or may consist of steel/CuPbSn composite materials or steel/aluminium or steel/white metal composite materials. Preferred alloy systems constituting the overlay are AlSnCu, AlSnPb and AlSnSi. In the case of an overlay consisting of a tin alloy, the tin content in the overlay decreases from the apex towards the partial surfaces of the sliding element, i.e. the overlay comprises areas with high and low tin contents. This makes it possible, for the first time, to exploit the advantages of high and low tin contents in the overlay simultaneously. While the area with high tin content ensures good running-in behaviour of the sliding element, the areas with low tin content ensure that the sliding element exhibits a high load-carrying capacity.

The thickness of the overlay is preferably uniform over the entire circumference.

The method of producing such half bearing overlays provides that a gas pressure of 0.1 to 5 Pa be set during the coating process in the apex area of the bearing shell.

The gas molecules between the vaporiser crucible and the surface to be coated effect scattering of the alloy components which varies during the vapour deposition process.

The scattering angle or degree of scattering depends, for kinetic reasons, on the relative density of the individual evaporated alloy elements. The consequence thereof is that heavy elements, such as tin for example, are less strongly scattered than lighter elements, for example aluminium. The result of these scattering processes is that the heavy elements are deposited in the apex area of the half bearing in higher concentration than in the area of the partial surfaces. This scattering by means of gas molecules makes it possible to vary the composition of the overlay within broad limits depending on the pressure range in which electron beam vapour deposition is effected.

Contrary to the opinion held in specialist circles, the layers produced with gas scattering are surprisingly compact and superior, with regard to their wear resistance properties and load-carrying capacity, to sliding elements produced conventionally or by electron beam vapour deposition without supplementary measures.

It has moreover surprisingly emerged that, in addition to the obtainment of different concentrations, it is also simultaneously possible to obtain a uniform layer thickness, such that supplementary measures, such as are known from DE 195 14 835 A1, may be dispensed with.

The production process is thereby simplified considerably.

The gas pressure may preferably be kept constant at 0.05 Pa during the coating process.

The method may be further modified by varying the gas pressure continuously during the coating process. If the gas pressure is varied as a function of vapour deposition time, a variation in composition over the layer thickness is also achieved, in addition to the graduated structure of the overlay in the circumferential direction.

The gas pressure is preferably increased continuously from 0.1 Pa at the beginning to 1 Pa at the end of the vapour deposition process. The increase in gas pressure has the effect that the alloy component having the low atomic weight is scattered increasingly to a greater degree than the heavy alloy elements, so increasing the difference in concentration between the apex area and the area of the partial surfaces during the course of the process. In this way, the concentration of the alloy components also varies over the layer thickness.

The inert gas used is preferably argon, helium or neon. The perpendicular distance between the half bearing and the vaporiser crucible must be set at 2 to 7 times the half bearing diameter and the coating rate in the apex area must be set at at least 20 nm/s.

THE DRAWINGS

The invention is described in more detail below with the aid of an exemplary embodiment and the drawings, in which.

DETAILED DESCRIPTION

Figure 1:
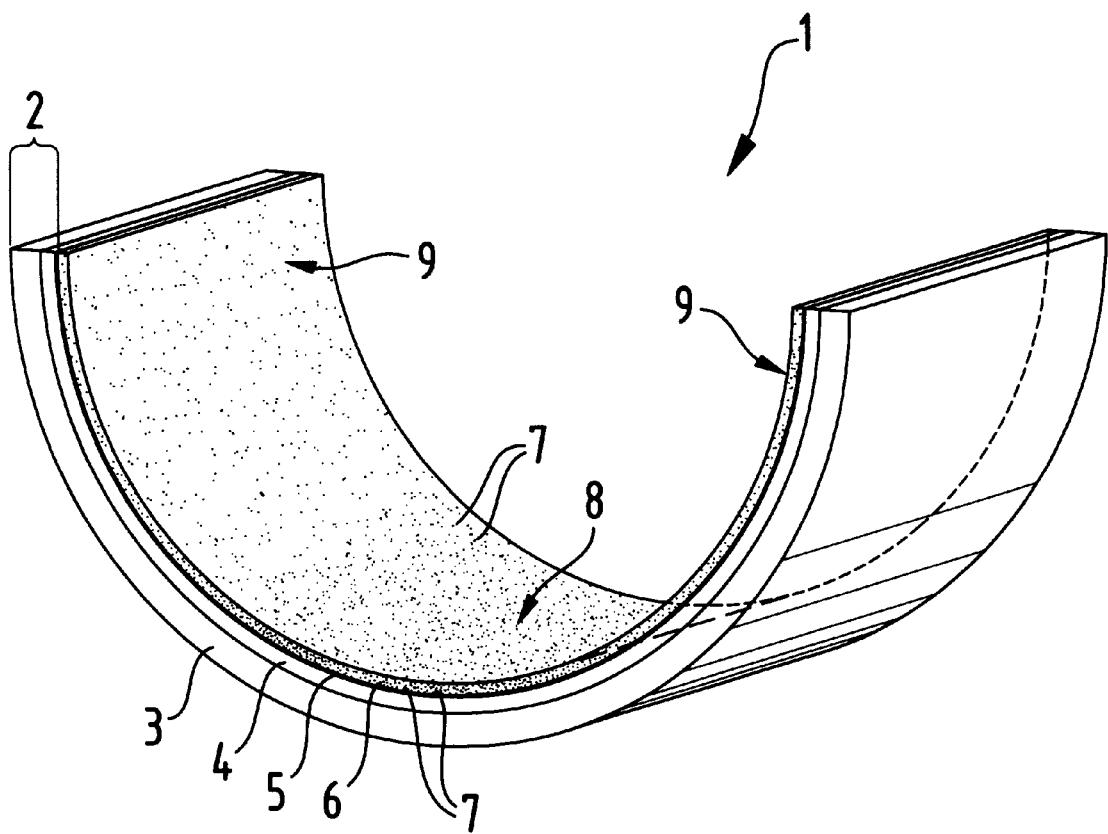
FIG. 1 is a perspective representation of a half bearing.

FIG. 1 shows a half bearing 1 having a backing member 2 and an overlay 6. The backing member 2 consists of a steel supporting shell 3, onto which a CuPbSn alloy 4 has been applied by a casting or sintering process together with a diffusion barrier layer 5. The carbon content of the steel is between 0.03% and 0.3%.

After various annealing and forming processes known per se, half bearings are produced from a strip by pressing strip pieces of a specific length. After surface machining of these bearings by drilling or rolling, the bearing shells are provided with a diffusion barrier layer 5 of nickel or a nickel alloy by an electroplating or a PVD process. The backing member is then degreased and introduced into a vacuum evaporation installation. Further surface cleaning or activation is effected therein by a sputtering and etching process.

After evacuation of the coating chamber, the latter is flooded with argon, the pressure being set at approximately 1 Pa. The backing member 2 is then coated by electron beam vapour deposition of AlSn20Cu from a vaporiser crucible by means of an axial electron gun. The thickness of the deposited overlay 6 of AlSn20Cu is approximately (16±4)

During the vapour deposition process, the argon pressure was kept constant at 1 Pa, the temperature of the backing member was 190° C. to 200° C. and the power of the electron gun amounted to from 40 to 60 kW. The deposition rate was at least 20 nm/s.

In the apex area 8, the overlay 6 exhibits a markedly higher concentration of tin than in the area 9 of the partial surfaces. The tin particles are designated by the dots 7. The higher concentration is illustrated by a higher dot density in the apex area 8.

Figure 2:
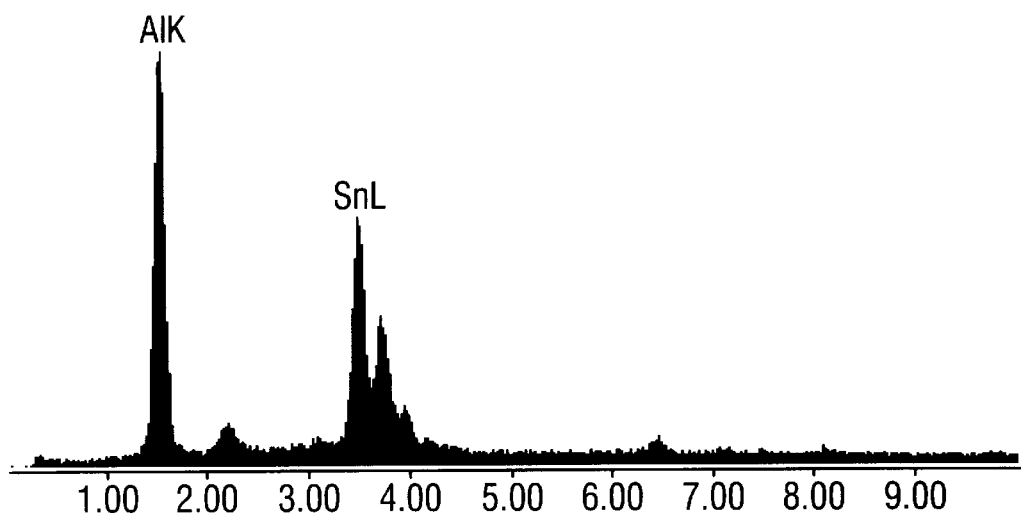
FIG. 2 is a diagram showing the alloy composition of the overlay in the apex area.
Figure 3:
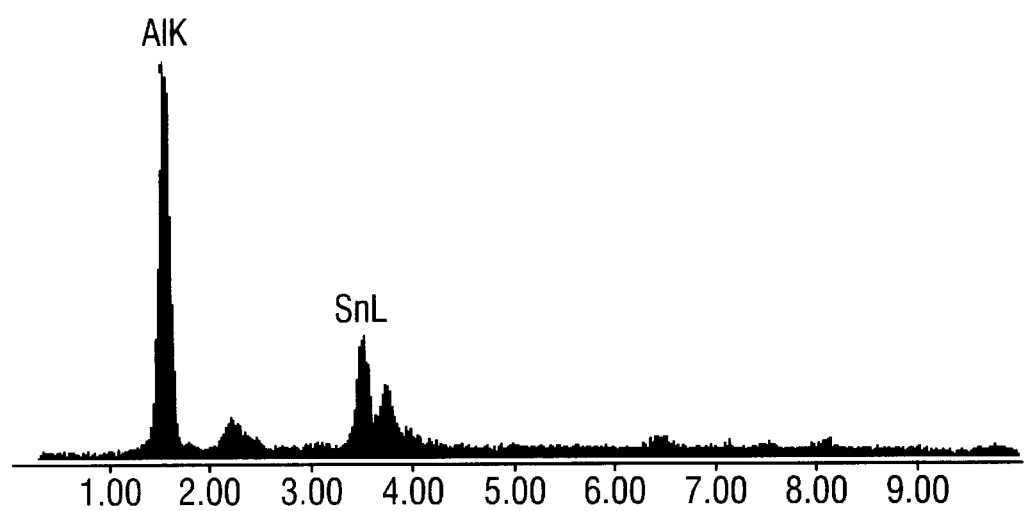
FIG. 3 is a diagram showing the alloy composition of the overlay in the area of the partial surfaces.

FIGS. 2 and 3 show the alloy composition in the apex area (FIG. 2) and in the area of the partial surfaces (FIG. 3). The tin content was determined by scanning electron microscope using EDX for a particular area of the vapour-deposited AlSn20Cu layer. The concentration of tin in the apex area 8 is higher than in the area of the partial surfaces by a factor of 1.4, the values being determined from integration of the tin peaks.

Figure 4:
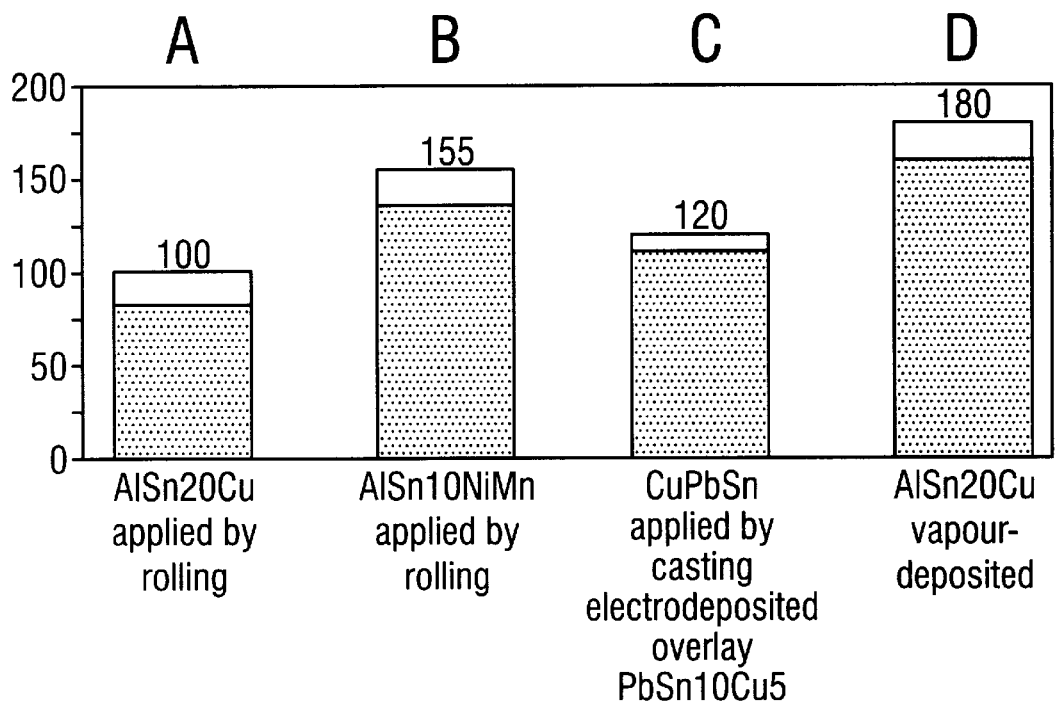
FIG. 4 is a diagram showing the limit loads, achievable in an Underwood test, for half bearings with overlays produced according to the invention, in comparison with conventional ternary and two-component bearings.

FIG. 4 directly compares the limit loads, obtainable using the Underwood test bench, of the bearing shells produced with graduated overlays according to the invention with conventional ternary and two-component bearings. An aluminium two-component bearing (bar A) with an overlay of AlSn20Cu (taken as 100%) was selected as the basis for these tests. Higher load-carrying capacities are provided by an AlSn-based two-component bearing (bar B), whose matrix is strengthened by the alloy elements nickel and manganese. The ternary bearing (bar C) with a steel/lead-bronze/electrodeposited layer (PbSn10Cn5) structure accepts loads which lie between the above-described two-component bearings. As FIG. 4 shows, the plain bearings (bar D) evaporation coated according to the invention are superior. to conventional bearing systems with regard to their load-carrying capacity.

What is claimed is:

1. A half bearing comprising a backing member and at least one metallic overlay, which is applied by electron beam vapour deposition and which comprises at least one finely dispersed component in a matrix material, the atomic weight of which component is greater than that of the matrix material characterised in that the concentration of the finely dispersed component (7) decreases continuously from the apex area (8) of the half bearing (1) towards the area (9) of the partial surfaces.

2. A half bearing according to claim 1, characterised in that the concentration of the finely dispersed component (7) in the apex area (8) is higher than in the area (9) of the partial surfaces by a factor of 1.2 to 1.8.

3. A half bearing according to claim 1, characterized in that the concentration of the finely dispersed component (7) is constant over the thickness of the overlay (6).

4. A half bearing according to claim 1, characterized in that the concentration of the finely dispersed component (7) increases continuously from the lower area to the upper area of the overly (6).

5. A half bearing according to claim 4, characterized in that the concentration of the finely dispersed component (7) is up to twice as great in the upper area of the overlay (6) as in the lower area.

6. A half bearing according to claim 1, characterized in that the concentration of the finely dispersed component (7) in the apex area (8) is between 10 and 70 wt. %.

7. A half bearing according to claim 1, characterized in that the matrix material comprises aluminum and in that the finely dispersed component (7) consists of tin, lead, bismuth and/or antimony.

8. A half bearing according to claim 1, characterized in that, as its other alloy component, the overlay (6) comprises copper, zinc, silicon, manganese and/or nickel individually or in combination in a proportion of up to 5 wt. %.

9. A half bearing according to claim 1, characterized in that the thickness of the overlay (6) is uniform over the entire circumference.

* * * * *

UNITED STATES PATENT AND TRADEMARK OFFICE
CERTIFICATE OF CORRECTION

PATENT NO.   : 6,139,191
DATED        : October 31, 2000
INVENTOR(S)  : Gerd Andler et al It is certified that error appears in the above-identified patent and that said Letters Patent is hereby corrected as shown below:     ON THE TITLE PAGE Section [57] ABSTRACT, line 1, after "bearing" insert -- is described which --.

Column 4, line 23, after "at" insert -- $\pm$ --.

Column 5, line 18, after "(16$\pm$4)" insert -- $\mu$m --.

Column 6, line 4, delete the period after the word "superior".

Signed and Sealed this

Eighth Day of May, 2001

*Attest:*

NICHOLAS P. GODICI

*Attesting Officer*        *Acting Director of the United States Patent and Trademark Office*